(12) United States Patent
Kim et al.

(10) Patent No.: US 11,133,248 B2
(45) Date of Patent: Sep. 28, 2021

(54) SEMICONDUCTOR STRUCTURE AND METHOD FOR FABRICATING THE SAME

(71) Applicant: XIA TAI XIN SEMICONDUCTOR (QING DAO) LTD., Qingdao (CN)

(72) Inventors: Hyunyoung Kim, Singapore (SG); Dowon Kwak, Singapore (SG); Kang-Won Seo, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/679,341

(22) Filed: Nov. 11, 2019

(65) Prior Publication Data

US 2021/0143097 A1 May 13, 2021

(51) Int. Cl.
*H01L 23/522* (2006.01)
*H01L 23/528* (2006.01)
*H01L 23/532* (2006.01)
*H01L 21/768* (2006.01)

(52) U.S. Cl.
CPC .... *H01L 23/5226* (2013.01); *H01L 21/76831* (2013.01); *H01L 21/76843* (2013.01); *H01L 21/76867* (2013.01); *H01L 21/76879* (2013.01); *H01L 21/76883* (2013.01); *H01L 23/528* (2013.01); *H01L 23/53209* (2013.01); *H01L 2221/1073* (2013.01)

(58) Field of Classification Search
CPC .......... H01L 21/76837; H01L 21/7682; H01L 21/76829; H01L 21/76834; H01L 21/76835; H01L 21/7685; H01L 21/76852; H01L 23/528; H01L 23/5226; H01L 23/5329; H01L 23/53295
See application file for complete search history.

(56) References Cited

U.S. PATENT DOCUMENTS

2006/0121685 A1\* 6/2006 Izumi ................ H01L 21/31604
438/396
2018/0047615 A1\* 2/2018 Cheng ............... H01L 29/66795

\* cited by examiner

*Primary Examiner* — Thanhha S Pham
(74) *Attorney, Agent, or Firm* — ScienBiziP, P.C.

(57) ABSTRACT

A semiconductor structure and a method of fabricating the same is disclosed. The semiconductor structure includes an interconnect structure that comprises: a plurality of conductive features over a substrate arranged separately adjacent one another; a liner conformally formed over and between the plurality of conductive features and defining a trench having a first depth between adjacent pair of the conducive features, wherein a horizontal coverage of the liner over respective top surfaces of the conductive features has thickness lower than that of a vertical coverage over respective sidewalls of the conductive features; and a dielectric layer on the liner over top surfaces of the conductive features, wherein the dielectric layer seals the respective trench and forms a void between adjacent pair of the conductive features.

14 Claims, 16 Drawing Sheets

US 11,133,248 B2

1

SEMICONDUCTOR STRUCTURE AND METHOD FOR FABRICATING THE SAME

FIELD

The present disclosure generally relates to fabrication of semiconductor device, and more particularly pertains to providing interconnect structure for semiconductor device having enhanced electrical characteristics.

BACKGROUND

As integrated circuits (IC) are developed, the desire for higher device density and operation speed becomes never-ending quests for those skilled in the art. With increased feature density in the interconnect structure, parasitic affects inevitably occurs and negatively impacts device performance.

The dielectric constant of a porous structure may be significantly lower than a conventional dielectric material. Replacing the conventional silicon dioxide with a low-κ dielectric material of the same thickness reduces parasitic capacitance noticeably, thus enabling faster switching speeds and better heat dissipation. However, with the introduction of voids into the device creates structural integrity concerns.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
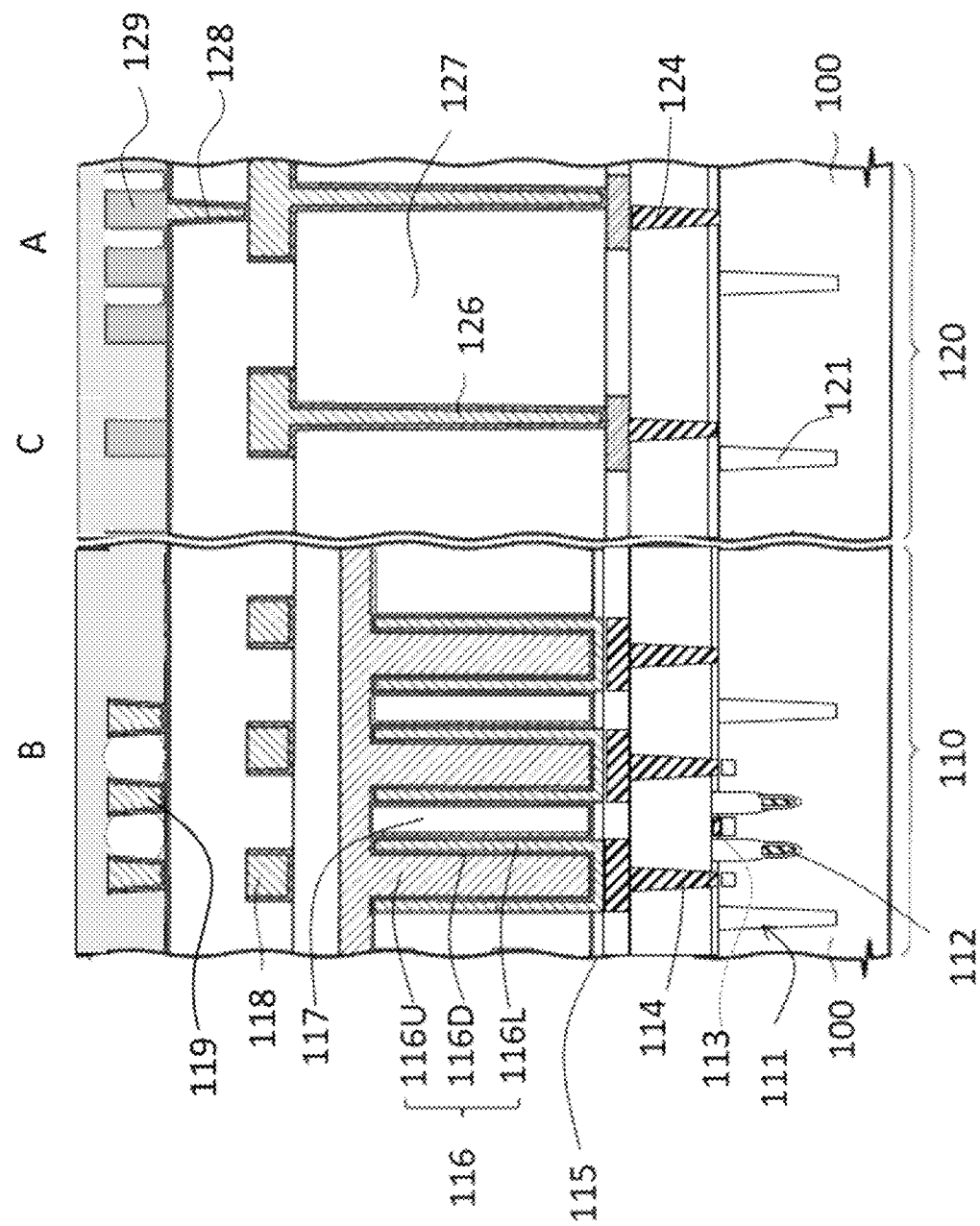
FIG. 1 shows a regional cross section view of a semiconductor device in accordance with some embodiments of the instant disclosure.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary embodiments in conjunction with the accompanying drawings in FIGS. 1 to 5. Reference will be made to the drawing figures to describe the present disclosure in detail, wherein depicted elements are not necessarily shown to scale and wherein like or similar elements are designated by same or similar reference numeral through the several views and same or similar terminology.

FIG. 1 shows a regional cross section view of a semiconductor device in accordance with some embodiments of the instant disclosure. The exemplary device includes a substrate 100 over which multiple layers of integrated circuit devices and features are formed. For illustrational simplicity and clarity, some detail/sub components of the exemplary device are not explicitly labeled in the instant figure.

The substrate 100 may comprise a crystalline silicon substrate. The substrate may comprise various doped regions depending on design requirements (e.g., p-type substrate or n-type substrate). The doped regions may be doped with p-type dopant, such as boron or BF2; n-type dopant, such as phosphorus or arsenic; and/or combinations thereof. In some alternative embodiments, the substrate 100 may be made of other suitable elemental semiconductor, such as diamond or germanium; a suitable compound semiconductor material, such as silicon carbide, gallium arsenide, gallium phosphide, indium phosphide, indium arsenide, and indium antimonide; an alloy semiconductor including SiGe, SiGeSn, GaAsP, AlInAs, AlGaAs, GaInAs, GaInP, and GaInAsP; other suitable materials; or combinations thereof. Furthermore, although a bulk substrate is utilized in the instant illustrative example, in some embodiments, the substrate may include an epitaxial layer (epi-layer) and/or may include a silicon-on-insulator (SOI) structure, such as a silicon-on-insulator (SOI) structure, SiGe-on insulator (SiGeOI), Ge on insulator (GeOI) and the like.

Several functional regions may be arranged laterally (e.g., horizontally across the page as shown in FIG. 1) over the substrate. By way of example, FIG. 1 shows a substrate of an exemplary device that includes two co-planar arranged functional regions defined thereon, e.g., a cell region 110 and a periphery region 120. In the illustrated example, the cell region 110 provides space to accommodate active circuit components (e.g., selection transistor 112) and passive circuit components (e.g., storage element, such as capacitor 116) of a dynamic random access memory (DRAM) device. Meanwhile, the periphery region 120 houses circuit components for supporting various functions of the DRAM operation, such as read out circuits, decoder circuits, and amplifier circuits. Different functional regions may include circuit components of different critical dimensions based on different design rules. The devices in different functional regions may be designed to function under different operational requirements (e.g., different voltage rage). Devices of different feature dimensions may be arranged on the same plane of a substrate (e.g., circuit chip) to achieve higher degree of integration, hence reduce signal path and enhance device performance.

The cell region may comprise array of memory unit cells. Each of the memory cell units typically includes a bit storage component (e.g., storage capacitor 116) and a selection component (e.g., transistor 112). The unit cells may employ suitable cell architecture, e.g., a 1-T cell format (as shown in the instant example) or other types of cell arrangement (such as a 3T cell layout, not shown). The cell region 110 of the illustrated device are shown to have two gate structures 112 embedded (buried) under a top surface of the substrate 100 in an active area that rests between isolation features 111 (e.g., shallow trench isolation (STI) structure). In some embodiments, the active area may be a raised island structure (with respect to a lower surface of the substrate) comprising an elongated strip overhead profile and surrounded by isolation structure (e.g., STI 111). In some embodiments, the active area may be obliquely arranged with respect to the traversing direction of a word line (e.g., the extending direction of the gate structure 112, which is in/out of the page in the illustrated example) at a slanting angle. The oblique arrangement of the active areas in folded/offset layout may allow more units cells to be packed in a same area while maintaining sufficient distance therebetween, thus achieving higher device density while reducing inter-cell interference (e.g., cross talk).

The gate structure 112 may be part of a memory cell selection device, such as a buried channel array transistor (BCAT). In the illustrated example, the active area (the region defined between a pair of isolation features 111) includes a pair of gate structures 112. The pair of gate structures 112 in turn respectively correspond to a pair of BCATs, whose source/drain (S/D) regions are respectively connected to a contact plug (e.g., contact plug/via 114). The contact plug 114 enables electrical connection between the selection transistor (e.g., BCAT) to a lower electrode (e.g., 116L) of a storage capacitor 116 (e.g., through a pad not specifically labeled). The gate structure 112 of an exemplary buried type device may include a recess-filling structure (in a cross sectional profile) embedded/buried in a gate trench in the active area. In DRAM applications, the gate structure 112 may be a laterally traversing linear structure (e.g., extending in/out of the page of, e.g., FIG. 1) that intercepts multiple adjacent active areas (and serves as a word line (WL) for a memory device).

The gate structure 112 comprises a gate electrode (not labeled) embedded at a lower portion of the gate trench (e.g., partially filling) in the active area. The gate electrode may include one or more conductive material such as doped polysilicon, or metal material such as tungsten, ruthenium, and cobalt. The gate structure 112 also comprises a gate insulation liner that lines the bottom portion of the trench, and is arranged between the gate electrode and the semiconductor material of the active area. The gate insulation liner may be a conformally formed insulating layer covering an inner side wall of the gate trench. The gate insulating liner may be made of insulating material such as silicon oxide, silicon nitride, silicon oxynitride, or a metal oxide. The metal oxide may include, for example, hafnium oxide, aluminum oxide, or titanium oxide. High-K dielectric materials may be utilized to complement metal based gate electrodes for enhancing the performance of a field effect transistor. In some embodiments, the gate structure 112 may further comprise a barrier liner conformally disposed between the gate insulating liner and the gate electrode. The gate barrier liner may comprise a barrier metal compound, such as, tungsten nitride (WN), titanium nitride (TiN) or tantalum nitride (TaN).

In the quest to pursue the ever-shrinking device form factor, the utilization of buried type transistor as selection device may ensure extended channel length (e.g., from a S/D region under a contact plug 114 vertically down to the bottom tip of the gate structure 112, then laterally across the tip of to the buried gate electrode and back up to the opposite S/D region under a neighboring contact plug), thereby achieving higher device density while alleviating the accompanied short channel effect. Nevertheless, selection device of other structural architecture may be utilized. For instance, in some embodiments, planar channel device or raised channel multi-gate devices (e.g., fin-type field effect transistor, FINFET) may also be used as selection device for a memory cell.

In the illustrated embodiment, a shared S/D region is defined between the pair of neighboring gate structures 112 in the active area (between STI structures 111. In some embodiments, bit line 113 is arranged over the shared S/D region formed between the gate structures 112 at a central region of the active area (between STI structures 111). The bit line 113 may be a linear conductive structure that extends in/out of the page as shown in the instant illustration, and electrically connects a plurality of S/D regions at the respective central region of multiple active areas (e.g., the respective S/D region of a plurality of active areas arranged in a roll; not shown in the instant regional cross section view).

The contact plug 114 may be formed in and through a dielectric layer (e.g., interlayer dielectric, ILD) above the active area, thereby establishing a vertical conductive path from the surface of the substrate 100 to upper layers of the device stack over the active area. In some embodiments, the contact plug 114 may serve as a storage node via/plug that enables vertical electrical connection with a lower electrode of a storage element (e.g., electrode 116L of the capacitor element 116). The dielectric layer may be made of materials such as oxide or nitride of silicon. In some embodiments, the dielectric layer may include low-K material having dielectric constant lower than, e.g., 3.9. The contact plug 114 may be made of one or more metal or non-metal conductive material, such as poly-silicon, tungsten, aluminum, etc.

Storage element (such as storage capacitor 116) may be formed over the contact plug 114 (e.g., above the corresponding contact pad over the plug) in a dielectric layer 117. The storage capacitor 116 comprises lower electrode 116L, upper electrode 116U, and capacitor dielectric 116D arranged between the upper and the lower electrodes.

A separation layer (e.g., layer 115) may be provided over the contact plug 114, through which the lower electrode of the storage capacitor 116 (e.g., bottom electrode 116L) is formed to establish electrical connection with the contact plug 14. The separation layer may comprise nitride material, e.g., silicon nitride, and serve as etch stop during the fabrication process of the capacitor structure. It is noted that the term "lower" electrode is made with respect to the surface of the substrate for the ease of referral, and shall not be construed as an undue limitation as to device orientation. The contact plug 114 provides a vertical conduction path between the source/drain region of the selection device (e.g., transistor 112) and the lower electrode of the storage element (e.g., electrode 116L).

In some embodiments, the lower electrode 116L may be a cylindrical conductive structure having high aspect ratio (i.e., high depth to width ratio), which corresponds to a tall upward opening U-shaped cross sectional profile (as shown the instant example). In some embodiments, a lateral width of the conductive structure may be few tens of nanometer in scale, e.g., having critical dimension of about 40 nm. In some embodiments, the aspect ratio of the lower electrode 116L may range from about 10 to 40. The lower electrode 116L may be formed from a conformal conductive film made of one or more conductive material(s) such as polysilicon, SiGe, BSRO ((Ba,Sr)RuO$_3$), CRO (CaRuO$_3$), LSCo ((La,Sr)CoO$_3$), TiN, TiAlN, TaN, TaAlN, W, WN, Ru, RuO$_2$, SrRuO$_3$, Ir, IrO$_2$, Pt, PtO, SRO (SrRuO$_3$).

The capacitor dielectric 116D may be a conformally formed layer that comprises a nitride, an oxide, a metal oxide, or a combination thereof. For example, the capacitor dielectric 116D may include a single or a multilayered film formed from silicon nitride, silicon oxide, a metal oxide (e.g., HfO$_2$, ZrO$_2$, Al$_2$O$_3$, La$_2$O$_3$, Ta$_2$O$_3$, and TiO$_2$), a perovskite dielectric material (e.g., STO (SrTiO$_3$), BST ((Ba,Sr)TiO$_3$), BaTiO$_3$, PZT, and PLZT, or a combination thereof. In some embodiments, high-K dielectric material may be applied to boost capacitor performance, e.g., enhance capacitance for a given electrode surface area.

The upper electrode 116U may be formed of one or more conductive material such as doped semiconductor, conductive metal nitride, metal, metal silicide, conductive oxide, or a combination thereof. For instance, the upper electrode 116U may be formed of conducive material(s) including BSRO ((Ba,Sr)RuO$_3$), CRO (CaRuO$_3$), LSCo ((La,Sr)CoO$_3$), TiN, TiAlN, TaN, TaAlN, W, WN, Ru, RuO$_2$, SrRuO$_3$, Ir, IrO$_2$, Pt, PtO, SRO (SrRuO$_3$), though the list of suitable material is merely exemplary and not exhaustive.

Additional conductive features, such as interconnect features 118 and 119 may be formed in additional inter metal dielectric layers over the upper electrode 116U to enable interconnection between circuit elements. The illustrated embodiment schematically shows three regions of varying feature densities: a highly dense region A having small feature separations; a moderate density region B with larger feature spacing, and a low feature density region C with isolated feature patterns.

As the level of device integration increases, feature density also increases. By way of example, the feature density among the interconnect features (e.g., planar interconnect components such as features 118/119/129, or vertical interconnect components such as features 114/124/126/128) is increased considerably in modern semiconductor devices compared to their preceding counterparts. As such, not only the feature dimension thereof shrinks, the inter-feature distance/separation is also reduced. Densely aggregated interconnect patterns in an inter metal dielectric layer may lead to adverse cross talk or parasitic effects.

In some embodiments, voids (e.g., air gaps) may be incorporated between interconnect features to alleviate the above-mentioned undesirable effects. As air has very low dielectric constant (of about 1.00000), voids in a structure can provide an equivalent dielectric constant of as low as about 1.00059. Thus, the dielectric constant of a porous structure may be significantly lower than a conventional inter metal dielectrics. In the instant embodiment, air gaps are generated between adjacent conductive features in regions A and B to provide reduced regional dielectric constant. In general, under permissible process circumstance, maximized air gap size and uniform air gap profile (e.g., identical width and height of voids) may provide enhanced result in cross talk reduction.

The isolated features in region C, on the other hand, may not need further reduction of local dielectric constant due to its isolated nature. It is to be noted that, the term "air gap" generally refers to the absence of material filling in a particular region (thereby forming a structure with void), and does not necessarily imply the gaseous content therein. In some embodiments, the voids between interconnect features may be substantially filed with one or more inert gas such as gaseous argon or nitrogen. In some embodiments, the voids (air gaps) between the interconnect features may be substantially vacuum.

The periphery region 120 may comprise various active device regions laterally separated by isolation features, such as STI 121. The active area may comprise active circuit components (such as transistors) that make up the periphery support circuits, e.g., read-out, decoder, or amplifier circuits. Over the active area there may be upper inter device layers, such as dielectric layer 127, through which contact via/plug 124 may be provided to enable vertical signal conduction from the surface of the substrate 100 to a higher device layer. The contact plug 124 may be connected to a corresponding contact pad (not specifically labeled) there-above in a fashion similar to that in the cell region 110.

Over the contact plug 124 of the presently illustrated embodiment is a dielectric layer 127, through which one or more high aspect ratio interconnect features (e.g., contact via 126) are formed. In some embodiments, the aspect ratio of the contact via 126 may have a range from about 10 to 40. In some embodiments, the dielectric layer 127 may be (at least partially) an lateral extension of the dielectric layer 117 from the cell region 110. In some embodiments, the design rules for the devices in periphery region 120 may assume a greater feature sizes than that in the cell region 110. In some embodiments, the active circuit components in the periphery region 120 are designed to operate at a higher voltage level than those in the cell region 110.

The high aspect ratio features in both the cell region 110 and the periphery region 120 are typically formed through a top-down fashion, such as etching. The etching of high aspect ratio features often takes place through one or more relatively thick device layer (e.g., interlayer dielectric 117 and 127). As etching operation proceeds to deeper into the dielectric layer, the residual and the narrow topography of the etched profile makes removing materials more difficult as depth increases. As such, a tapered etch profile is often resulted in the high aspect ratio feature. Sometimes the taper angle of such high aspect ratio feature may deviate substantially from a normal direction with respect to a substrate surface. In some applications, the substantially tapered feature profile may hinder device performance.

For instance, the conductance quality of the high aspect ratio interconnect feature (e.g., via/plug 127) is related to a cross-sectional area thereof. A tapered etch profile leads to reduced cross sectional area (e.g., at lower section of the plug), which results in increased electrical resistance. Similarly, the performance of a capacitor (e.g., cell capacitor 116) is proportionally related to a surface area of the electrode. Although a high aspect ratio profile may provide increased operational efficiency of the storage capacitor 116, a tapered feature profile (with respect to a normal of the substrate, e.g., wider top, narrower bottom) in a capacitor structure still does not maximize electrode surface area, thus undermining device performance. Accordingly, in some embodiments, special process arrangement and technique could be utilized to generate high aspect ratio feature having lateral/sidewall profile that is substantially normal (vertically perpendicular) with respect to a major surface of the substrate.

Figure 2:
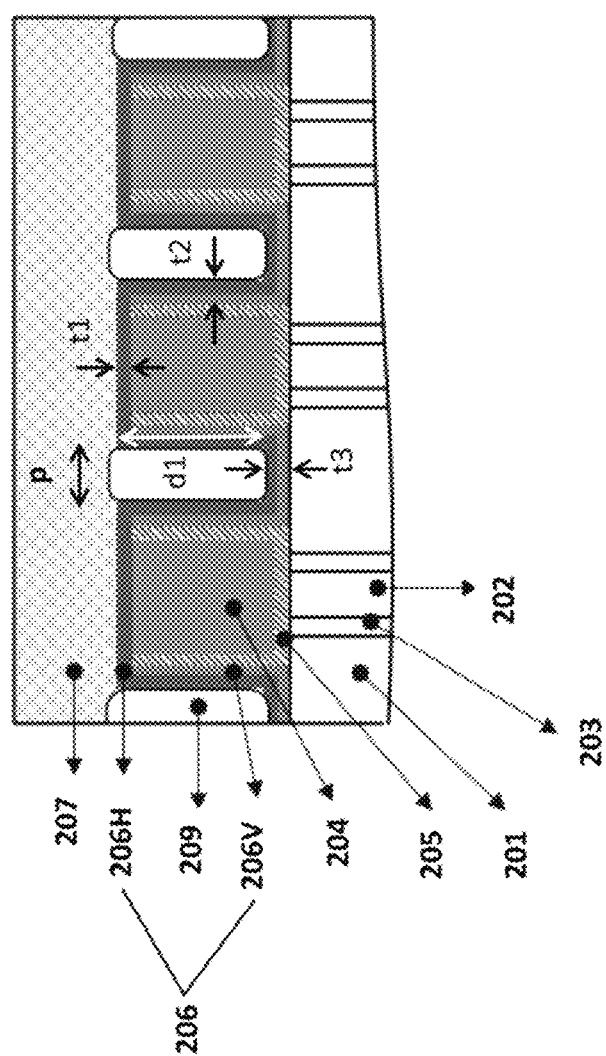
FIG. 2 illustrates a schematic regional cross-sectional view of an interconnect structure in accordance with some embodiments of the instant disclosure.

FIG. 2 illustrates a schematic regional cross-sectional view of a semiconductor device in accordance with some embodiments of the instant disclosure. Specifically, FIG. 2 shows an regional sectional view of an interconnect structure in a semiconductor device in accordance with some embodiments of the instant disclosure. For one thing, the interconnect structure may include conductive feature(s) disposed in an inter metal dielectric layer (IMD) over a device region, such as features 118 in a lower IMD layer above region 110, as well as features 119 and 129 disposed in an upper IMD layer over regions 110 and 120, respectively (as shown in FIG. 1).

As shown in FIG. 2, the exemplary interconnect structure comprises a plurality of conductive features 204 over a substrate (e.g., substrate 100 as shown in FIG. 1). The conductive features 204 may be interconnect components arranged separately adjacent one another. In some embodiments, the conductive feature 204 may include a portion of a horizontally traversing conductive line (e.g., with respect to a major surface of a substrate) that enables lateral signal conduction among different circuit components.

The conductive feature 204 may be arranged above a device region on a substrate, and electrically connects interconnect features from a lower layer, e.g., a vertical interconnect component, such as a contact plug/via 202 formed in a lower dielectric layer 201. The contact plug/via 202 may comprise one or more metal material, and may further include a sidewall liner 203 formed between the plug 202 and the dielectric layer 201. The sidewall liner 203 may comprise one or more material that facilitates adhesion between metal feature (e.g., plug/via 202) and dielectric material (e.g., layer 201), as well as preventing diffusion of metal material into inter metal dielectric layer.

A liner 206 is conformally formed over and between the plurality of metal features, and defining a trench having a first depth (d1) between adjacent pair of the metal features. The liner 206 may comprise a composite structure that is, at least partially, formed of more than one liner layers (e.g., multiple sub-liner layers). The sub-liner layers may include substantially identical material or dielectrics having similar characteristics. The horizontal coverage of the liner (e.g., 206H) over respective top surfaces of the conductive features 204 has thickness (e.g., t1) lower than that of the vertical coverage (e.g., 206V, having thickness t2) over respective sidewalls of the conductive features 204.

A dielectric layer 207 is formed on the liner 206 over top surfaces of the conductive features 204. The dielectric layer 207 seals the respective trench and forms a void (e.g., air gap) 209 between adjacent pair of the conductive features 204.

While the regional incorporation of air gap in the device structure (e.g., interconnect structure as shown in FIG. 2) may substantially reduce parasitic capacitance and attain better device performance, the lack of structural support at the void region may impose additional fabrication challenges. For one thing, the structure at the air gap region may be more prone to structural damage (e.g., delamination/ collapse) and/or chemical contamination issues when subject to fabrication processes such as chemical mechanical polishing.

In some embodiments, the liner 206 comprises one or more layer/sub-layers of dielectric material(s) that possesses etching selectivity with respect to a lower dielectric layer (e.g., layer 201). In some embodiments, the liner 206 may be prepared by deposition methods such as plasma enhanced chemical vapor deposition (PECVD) and atomic layer deposition (ALD) techniques. In some embodiments, the lower dielectric layer comprises silicon oxide dielectrics (e.g., $SiH_4$, TEOS based oxide materials prepared by plasma enhanced chemical vapor deposition/PECVD, atomic layer deposition/ALD, or spin-on dielectric/SOD methods), while the liner 206 comprises nitrogen-containing dielectrics such as SiN, SiCN, SiON, among others.

In some embodiments, the liner 206 comprises one or more layer/sub-layers of dielectric material(s) having anti-diffusion properties. For instance, when the conductive feature 204 substantially comprises low resistivity metal material such as copper, the barrier material(s) in the liner 206 may help to contain the active copper material, and prevent copper diffusion into surrounding dielectric structures due to, e.g., electromigration effect. In some embodiments, the anti-diffusing barrier in the liner 206 comprises nitrogen based dielectrics such as SiN, SiCN, SiON, or a combination thereof. In some embodiments, the liner 206 has a thickness (e.g., average, or a regional thickness) of more than 3 nm.

In the illustrated embodiment, a sidewall covering portion (e.g., vertical coverage 206V) of the liner is provided with greater thickness than a top covering portion (e.g., horizontal coverage 206H) thereof. In some embodiments, a trench bottom portion of the liner 206 (e.g., the bottom lining portion between adjacent conductive features 204 having a thickness t3) has a greater thickness than the top covering portion (e.g., 206H) thereof. In some embodiments, the horizontal coverage 206H of the liner may have a thickness of about 2 nm-5 nm. In some embodiments, the vertical coverage 206V of the liner may have a thickness of about 4 nm-10 nm. In some embodiments, a thickness ratio between the horizontal coverage 206H of the liner to the vertical coverage 206V of the liner ranges from about 0.3 to 0.7. The increased thickness of the vertical coverage 206V of the liner 206 provides additional mechanical support to the sealing dielectric layer 207 above, thereby enhancing structural integrity at the regions around air gap 209.

In some embodiments, the interconnect structure may comprise a plurality of conductive lines (e.g., having cross sectional profile as shown by feature 204 in FIG. 2) over a substrate. The conductive lines may be metal lines having sections that extend abreast one another at predetermined separation P (e.g., pitch distance between conductive lines). In some embodiments, the conductive line may comprise a seed layer 205 having a U-shaped sectional profile formed around sidewall and bottom surfaces at its interface with the dielectric liner (e.g, liner 206). The seed layer 205 may be a thin layer prepared by, e.g., physical vapor deposition (PVD), CVD, ALD, and contain metal material such as TiN, Ta, TaN, Cu, CuMn, Co, Ni, Ag, Au, Pt, among others, for facilitating conductor deposition to form the conductive lines (e.g., through subsequent electrode-plating process). In some embodiments, the seed layer comprises identical conductive material as that forms/fills the metal line, and therefore may become un-observable in a final device structure.

In addition, the interconnect structure comprises a dielectric liner (e.g., liner structure 206) conformally formed over and between the plurality of conductive lines. As such, a trench having a first depth d1 (e.g., a height of trench between lines) is defined between adjacent pair of the metal lines. A horizontal coverage (e.g., portion 206H) of the liner over respective top surfaces of the conductive lines has thickness lower than a vertical coverage (e.g., portion 206V) thereof over respective sidewalls of the metal lines. The interconnect structure further comprises a dielectric layer (e.g., sealing layer 207) formed on the dielectric liner over top surfaces of the conductive lines. The dielectric layer forms an arch structure that extends into and seals the respective trench, and defines an air channel (e.g., air gap 209) between adjacent pair of the metal lines. Further details of structural arrangement of an interconnect structure in accordance with the instant disclosure will be discussed in later sections, e.g., with respect to embodiments that correspond to FIGS. 14 and 15.

FIGS. 3-13 show intermediate structures during various stages of fabrication processes in accordance with some embodiments of the instant disclosure. Moreover, sub-figures (A), (B), and (C) correspond to interconnect structures formed at regions with different feature densities, such as the regions A, B, and C illustrated in FIG. 1. For instance, sub-FIG. 3(A) corresponds to a region having high feature density; sub-FIG. 3(B) corresponds to a region with wider feature separation; while sub-FIG. 3(C) corresponds to a low density region having isolated feature patterns.

Figure 3:
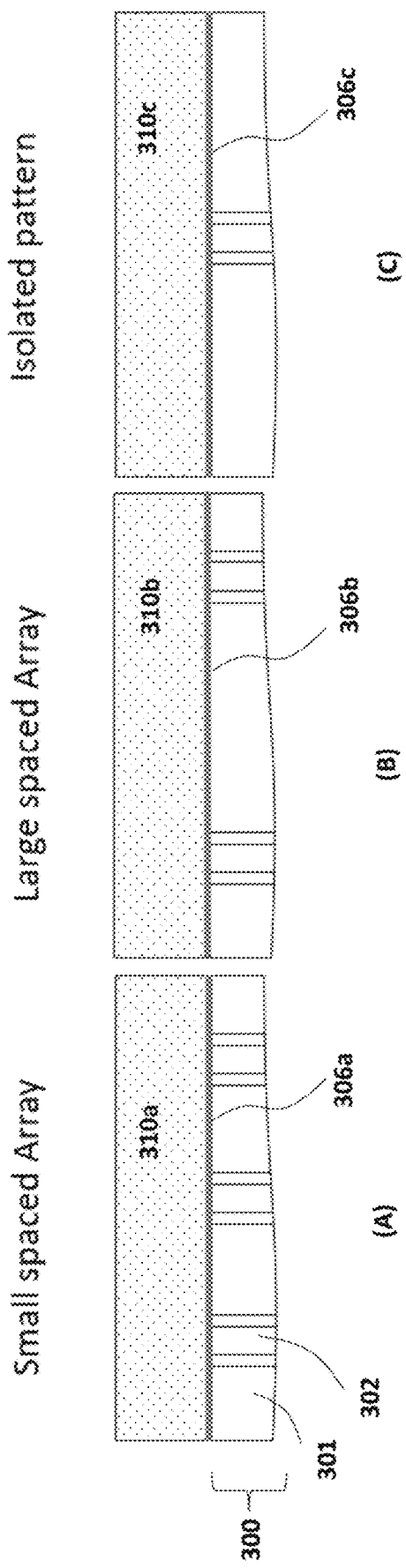
FIGS. 3-13 show intermediate structures during various stages of fabrication processes in accordance with some embodiments of the instant disclosure.

FIG. 3 shows a regional view of an intermediate structure of a semiconductor device in accordance with the instant disclosure during an exemplary fabrication process. In the illustrated process, a first dielectric layer 306 (which corresponds to portions 306a, 306b, and 306c over respective density regions A, B, and C) is formed on a lower device layer (e.g., layer 300, which may include dielectric layer 301 and vertical interconnect feature 302 formed therein) over a substrate. In some embodiments, the first dielectric layer 306 may be prepared by PECVD or ALD deposition methods.

A second dielectric layer 310 (which corresponds to portions 310a, 310b, and 310c over respective density regions, A, B, and C) is subsequently disposed on the first dielectric layer 306. The first dielectric layer 306 may be a thin layer compared to the layer 310 and possesses etch selectivity with respect thereto, and serves as an etch stop layer (ESL) for subsequent interconnect formation process. In some embodiments, layer 306 may include materials such as SiN, SiCN, SiON and other Si and N containing materials, which possesses etching selectivity with respect to layer 310. Layer 310 may comprise $SiO_2$ material prepared by, e.g., $SiH_4$, TEOS based oxide materials through PECVD, ALD or SOD deposition methods.

As the abovementioned sub-portions of typically share substantially the same attributes (e.g., at a same level of a device layer, same thickness, same material), numeral labels for comparable sub-regions will be selectively omitted for illustration simplicity in the following figures.

Figure 4:
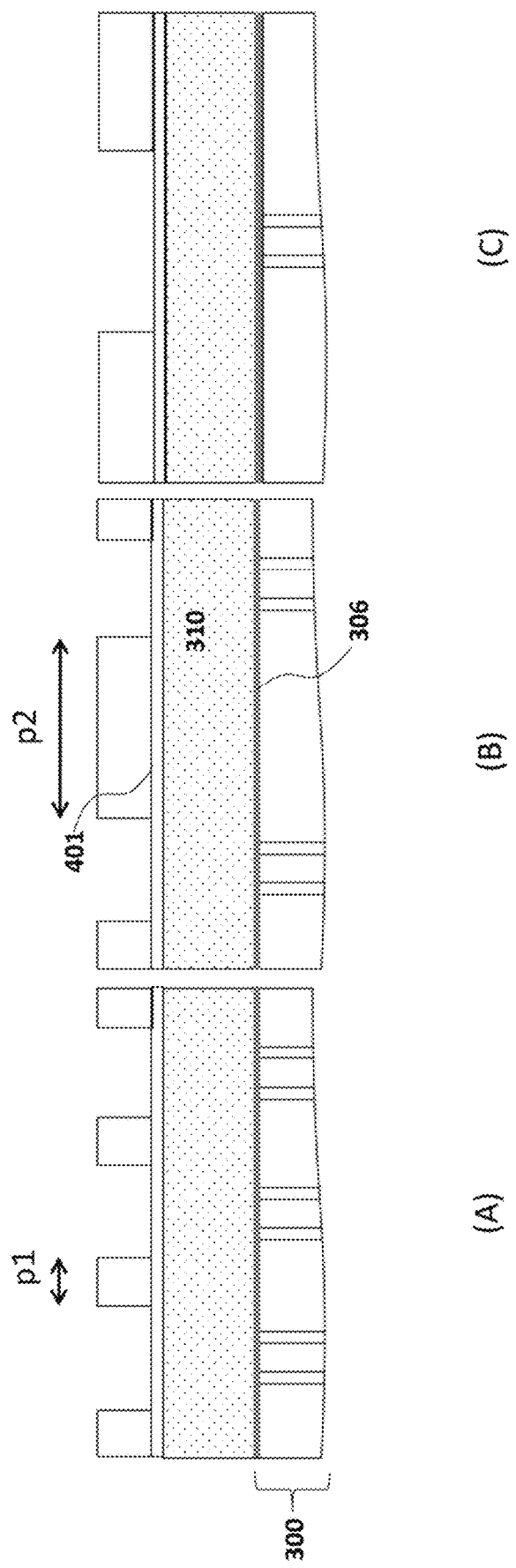

FIG. 4 shows a regional view of an intermediate structure of a semiconductor device in accordance with the instant disclosure during an exemplary fabrication process. In the illustrated figure, a patterning process is performed. By way of example, patterning mask 401 (which may include a stack of anti-reflective layer, e.g., SiON, photo resist, hard mask layers, etc.) is disposed over the second dielectric layer 310, and circuit patterns are defined thereon, e.g., by exposure and development through one or more photomasks. The circuit pattern may include linear patterns that correspond to horizontal interconnecting lines. In some embodiments, circuit patterns include a plurality of line patterns having sections extending abreast one another at predetermined separation (e.g., p1, p2). In some embodiments, the separation between linear patterns may be about 80 nm or less (e.g., p2 in region B). In some embodiments, the separation between linear patterns may be about 40 nm or less (e.g., p1 in region A). The separation between linear patterns may substantially translate to the pitch distance between subsequently formed interconnect features and the corresponding air gap profile there-between.

Figure 5:
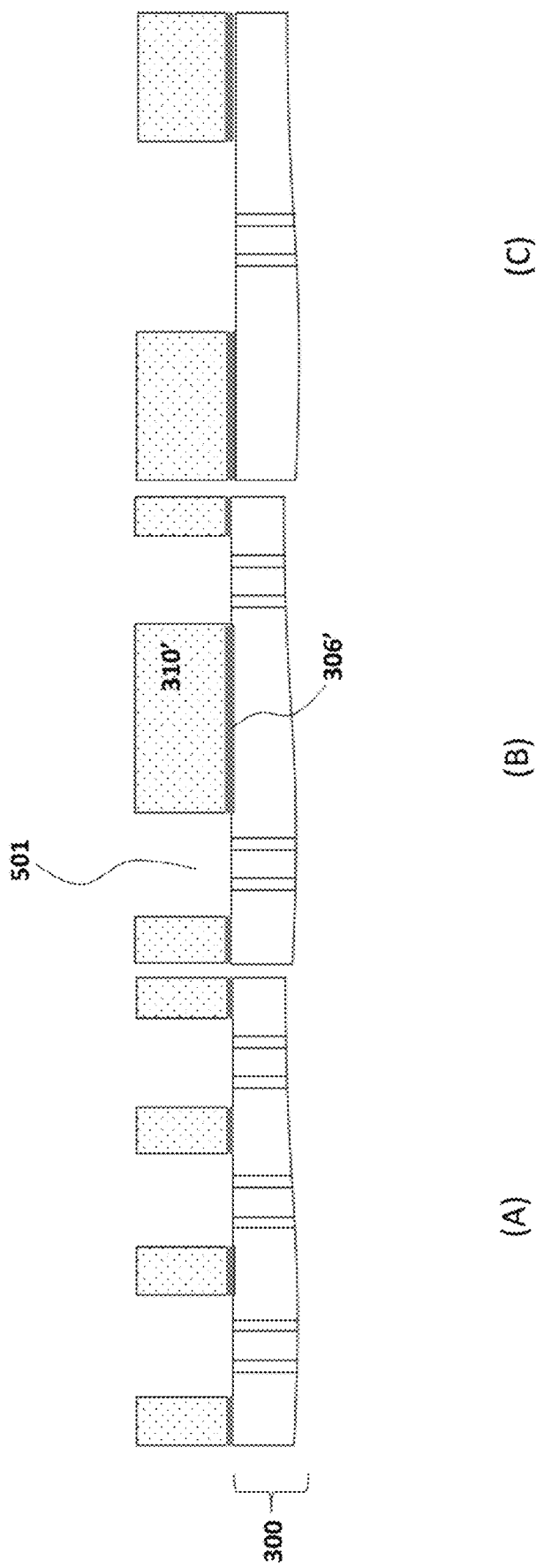

FIG. 5 shows a regional view of an intermediate structure of a semiconductor device in accordance with the instant disclosure during an exemplary fabrication process. In the illustrated figure, circuit patterns defined by photo-mask (e.g., patterning mask 401 as previously shown) are transferred to the second dielectric layer 310, e.g., through an etching process. Removed portions of the second dielectric layer 310 form trench openings (e.g., recess 501) over the lower device layer 300, thus generating a patterned second dielectric layer 310'. During the process, the first dielectric layer 306 may serve as etch stop to enable accurate termination of the etching operation without causing damage to the device features in the lower device layer 300. Moreover, the first dielectric layer 306 is also selectively opened to expose device features in layer 300 (e.g., vertical interconnect components 302 as previously shown), thus generating a patterned first dielectric layer 306'. In some embodiments, the exposure of lower device feature (from the first dielectric layer 306') is achieved through a separate etching operation. In some embodiments, the exposed material of the first dielectric layer 306' may not be fully removed through the trench opening, and a step profile at a bottom corner of the trench may be formed (not shown).

Figure 6:
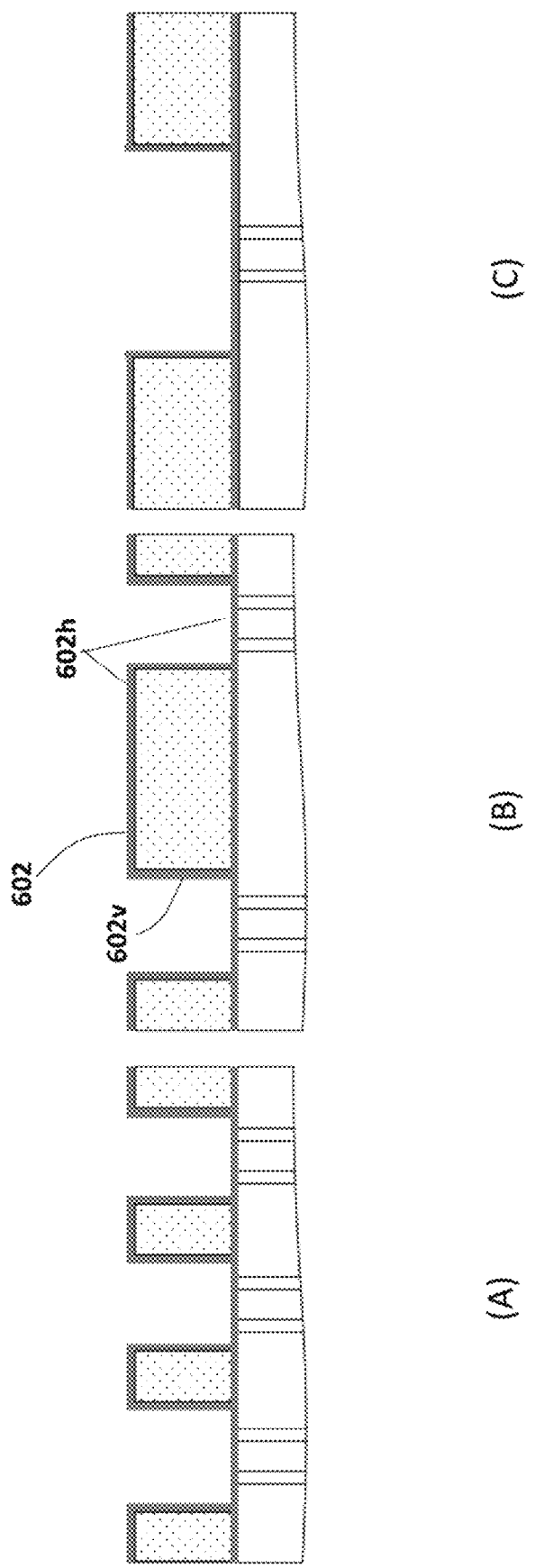

FIG. 6 shows a regional view of an intermediate structure of a semiconductor device in accordance with the instant disclosure during an exemplary fabrication process. In the illustrated figure, a first liner 602 having different etch selectivity from the second dielectric layer 310 is disposed substantially conformally over exposed surfaces of the linear recess features (e.g., recess 501) in the second dielectric layer 310. The liner 602 includes a horizontal coverage portion 602h over the top surface of the second dielectric layer 310 and a vertical coverage portion 602v over the vertical trench sidewall surface thereof. Moreover, the horizontal coverage 602h further covers device features in the lower layer (e.g., vertical interconnect components 302 in layer 300).

The first liner 602 may be another thin layer (compared to the layer 310) that possesses etch selectivity with respect thereto. By way of example, the liner 602 possess step coverage over the exposed recess pattern surfaces (e.g., recess 501) without filling the openings, and serves as an etch stop layer (ESL) for subsequent interconnect formation process. In some embodiments, liner 602 may include materials such as SiN, SiCN, SiON and other Si and N containing materials, which possesses etching selectivity with respect to layer 310.

Figure 7:
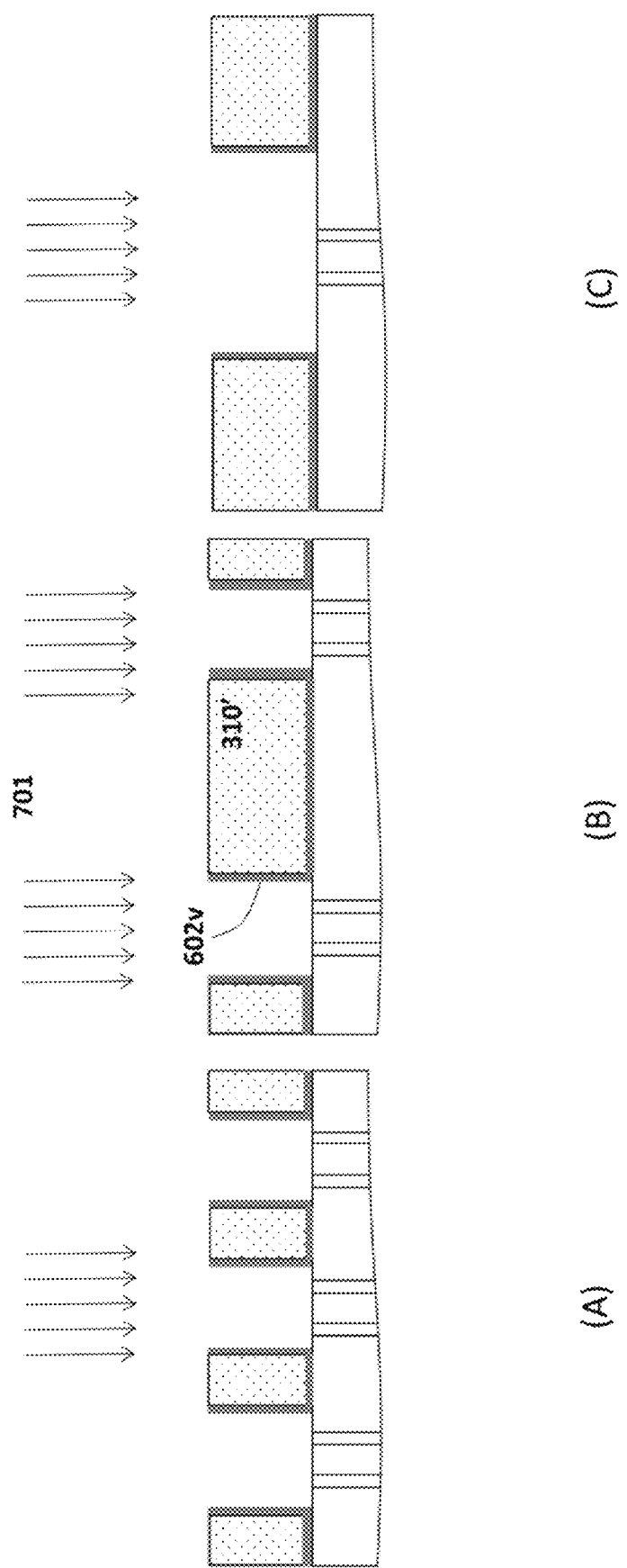

FIG. 7 shows a regional view of an intermediate structure of a semiconductor device in accordance with the instant disclosure during an exemplary fabrication process. In the illustrated figure, an anisotropic etching operating is performed to selectively remove horizontal coverage of the liner 602 (e.g., portion 602h as mentioned previously). The etching operation may employ wet or dry etch techniques that provide directional selectivity, e.g., capable of removing horizontally extending material coverage without substantially damaging vertical liner coverage (e.g., leaving portion 602v over sidewalls of the patterned layer 310'). The etching operation causes exposure the previously covered lower device features (e.g., feature 302 as previously shown), as well as reducing/removing the horizontal liner coverage (e.g., portion 602h) from top surface of the patterned second dielectric layer 310'.

Figure 8:
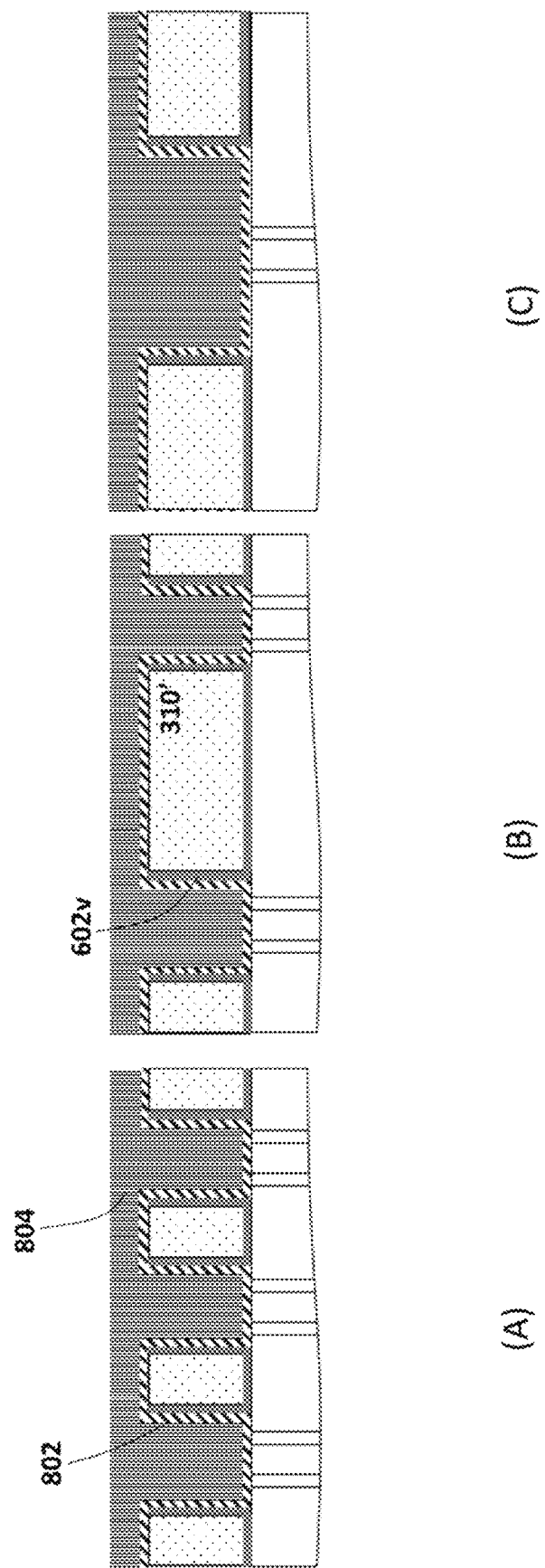

FIG. 8 shows a regional view of an intermediate structure of a semiconductor device in accordance with the instant disclosure during an exemplary fabrication process. In the illustrated figure, a conductor deposition process is performed, in which conductive material 804 is disposed over the patterned second dielectric layer 310' and filling the space (e.g., recess 501) between the vertical coverage 602v over the sidewall. In some embodiments, the conductive material 804 disposed in exposed region of the recess features (e.g., vertical coverage 602v in recess feature 501) corresponds to a plurality of conductive lines with vertical liner coverage from the first liner (e.g., liner 602) over respective sidewall surfaces that define the recesses 501).

In some embodiments, the conductor deposition process includes disposing a seed layer 802 conformally over exposed surfaces of the recess pattern surfaces (e.g., in recess 501 and over outer surface of vertical coverage 602v). In some embodiments, the seed layer 802 includes conductive materials such as Ta, TaN, Ti, Cu, CuMn, Co, Ni, Ag, Au, Pt, metal nitrides, or a combination thereof. In some embodiments, the seed layer 802 may be prepared by film deposition techniques such as PVD, CVD, or ALD. In some embodiments, the conductive material 804 includes one or more metal material such as Cu, Co, Ag, Au, W, disposed through method such as electroplating process. In some embodiments, the seed layer 802 may comprise identical material as that employed in the conductive material 804, in which case a boundary between the structural features may not be observable.

Figure 9:
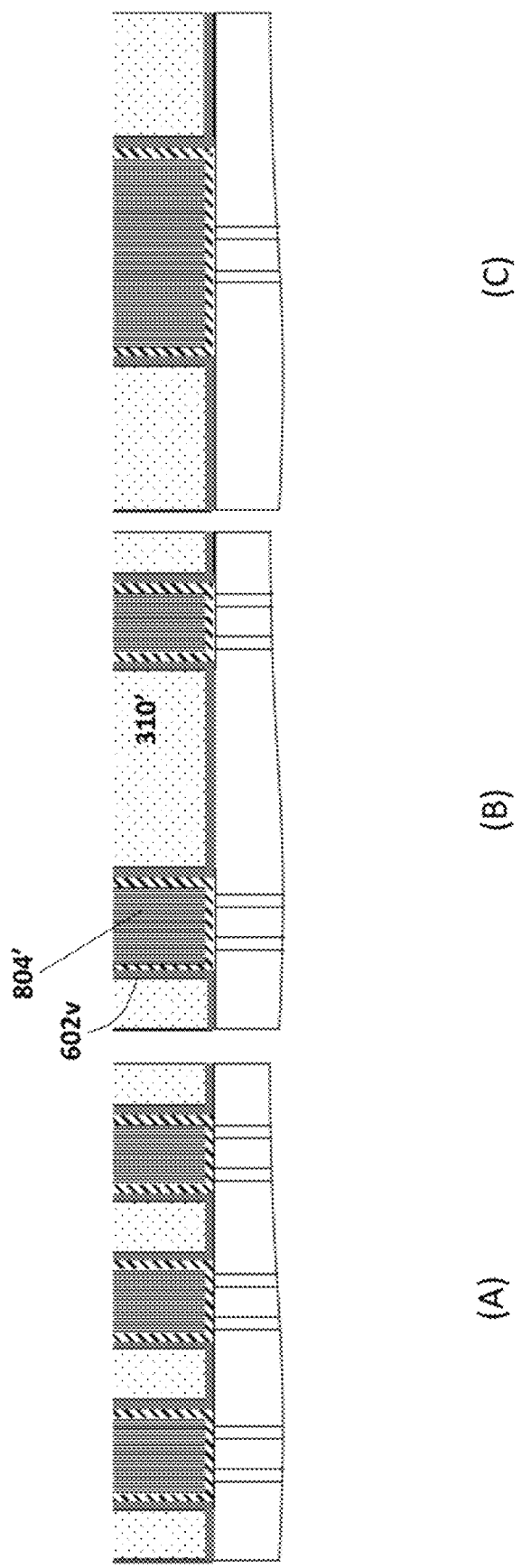

FIG. 9 shows a regional view of an intermediate structure of a semiconductor device in accordance with the instant disclosure during an exemplary fabrication process. In the illustrated figure, a conductor separation is performed to remove horizontally connected portions of the conductive material 804 (and the seed layer 802) over the top surface of the patterned dielectric layer 310'. In some embodiments, the conductor separation operation may include a chemical mechanical polishing (CMP) process. Upon removal of conductive material between the conductor-filled recess features, individual conductive features 804' are formed in (and between) the patterned dielectric layer 310' as shown in the instant cross sectional view. Accordingly, top surface of the respective conductive feature 804' and an upper portion/tip portion of the vertical coverage 602v is exposed from the dielectric layer 310'.

Figure 10:
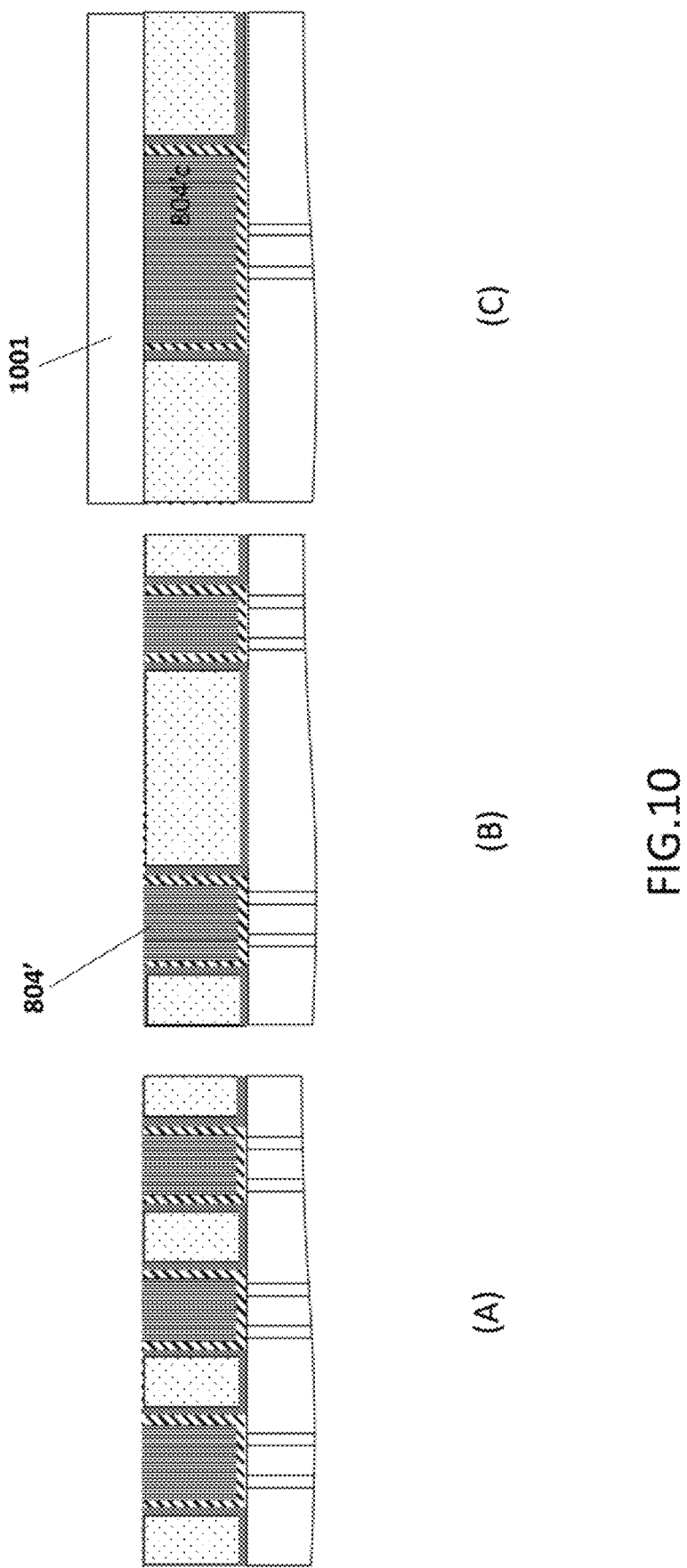

FIG. 10 shows a regional view of an intermediate structure of a semiconductor device in accordance with the instant disclosure during an exemplary fabrication process. In some embodiments, a mask 1001 may be provided over selective region over the substrate of the semiconductor device. By way of example, the mask 1001 is selectively formed to cover the low feature density region C (e.g., with isolated feature pattern 804'c) in preparation for subsequent fabrication process.

Figure 11:
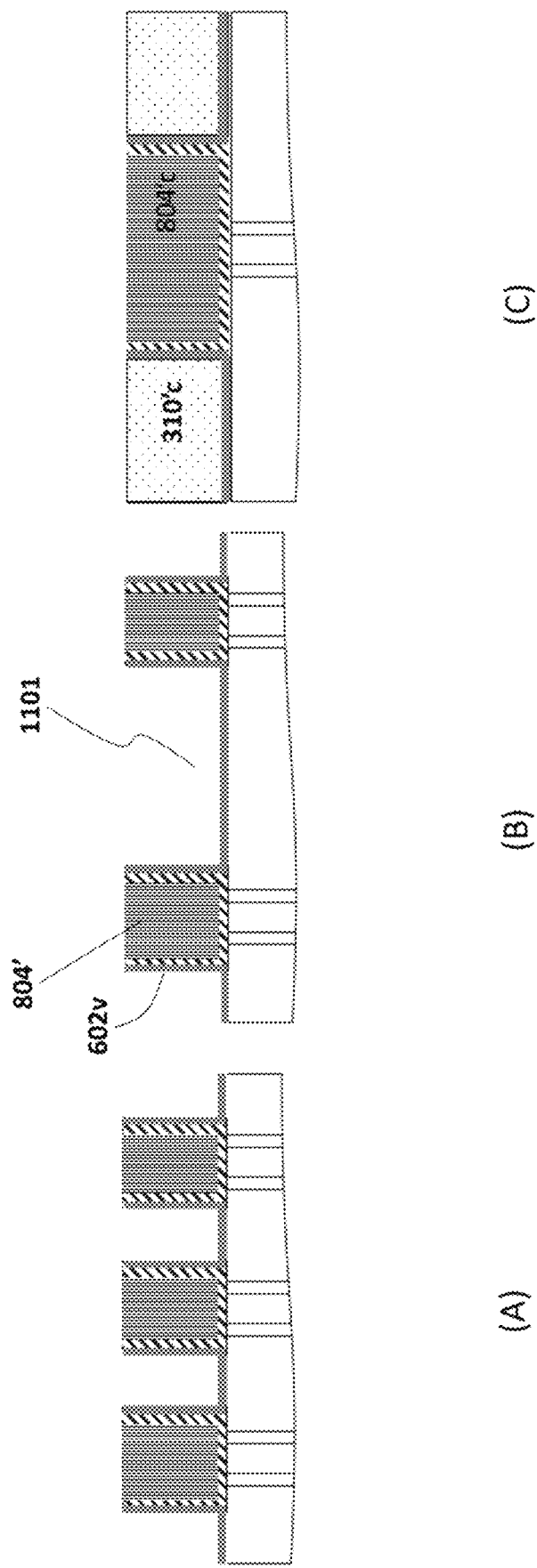

FIG. 11 shows a regional view of an intermediate structure of a semiconductor device in accordance with the instant disclosure during an exemplary fabrication process. In the illustrated figure, an etch operation is performed over the patterned dielectric layer (e.g., layer 310' as previously shown). The etch operation may include suitable wet or dry etch that provides good selectivity with respect to the first liner 602 (e.g., vertical coverage 602v) to enable substantial removal of the patterned dielectric layer 310' from the unmasked regions (e.g., regions A and B). Accordingly, the vertical coverage 602v over sidewalls of the conductive feature 804' is exposed, and gap 1101 is generated between the pair of adjacent conductive features 804'. In contrast, the dielectric layer in the masked region (e.g., layer 310'c in the isolated pattern region C) remains.

Figure 12:
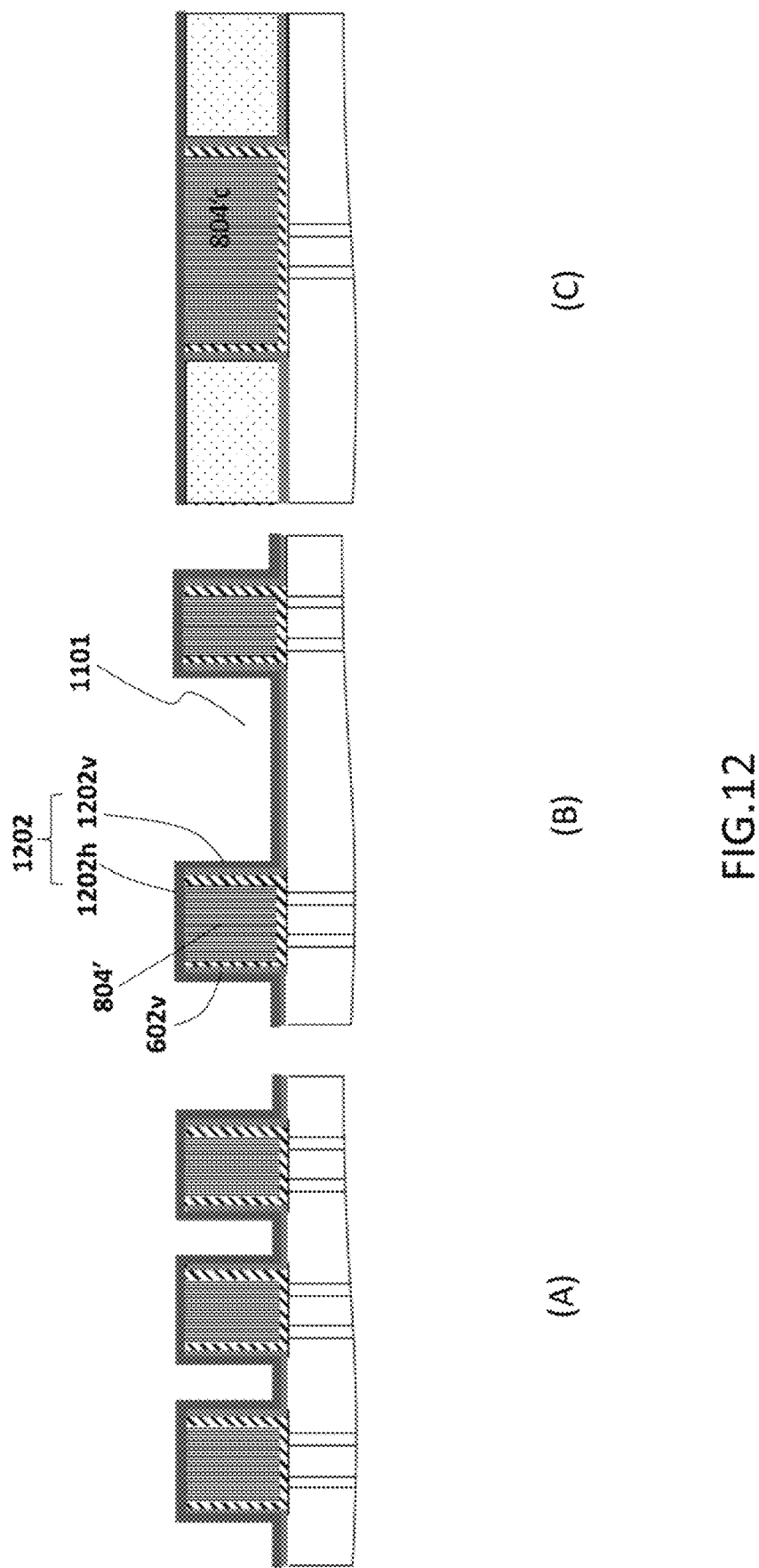

FIG. 12 shows a regional view of an intermediate structure of a semiconductor device in accordance with the instant disclosure during an exemplary fabrication process. In the illustrated figure, a second liner 1202 is disposed conformally over the conductive feature 804' to increase thickness of vertical liner coverage (e.g., portion 602v) over the respective sidewall surface thereof. The second liner 1202 comprises a dielectric material having different etch selectivity from the second dielectric layer 310. In some embodiments, the second liner 1202 comprises one or more materials such as SiN, SiCN, SiON, or other Si and N containing materials prepared by, e.g., PECVD or ALD/PEALD deposition method. In some embodiments, the second liner 1202 comprises a nitride containing layer with high hardness capable of preventing metal diffusion. The second liner 1202 provides coverage over the lateral surface of the conductive feature 804' (e.g., over the vertical coverage 602v formed from the first liner 602) as well as the horizontal top surface thereof.

In addition, similar to the first liner 602, the second liner 1202 also provides horizontal coverage over the trench bottom surface (e.g., top facing bottom surface in the gap 1101) between adjacent conductive features 804'. The second liner 1202 not only may provide passivation for the conductive feature 804' at its side and top faces (e.g., preventing oxidation and diffusion of conductive material), it may further increase the thickness of overall vertical coverage over the lateral surface of the conductive feature 804'. Accordingly, the structural rigidity at gap regions between adjacent conductive features may be enhanced for subsequent fabrication process. On the other hand, the second liner 1202 over the isolated pattern region C forms a substantially planar coverage of the isolated conductive feature (e.g., 804'c) and the un-removed dielectric layer 310'c.

Figure 13:
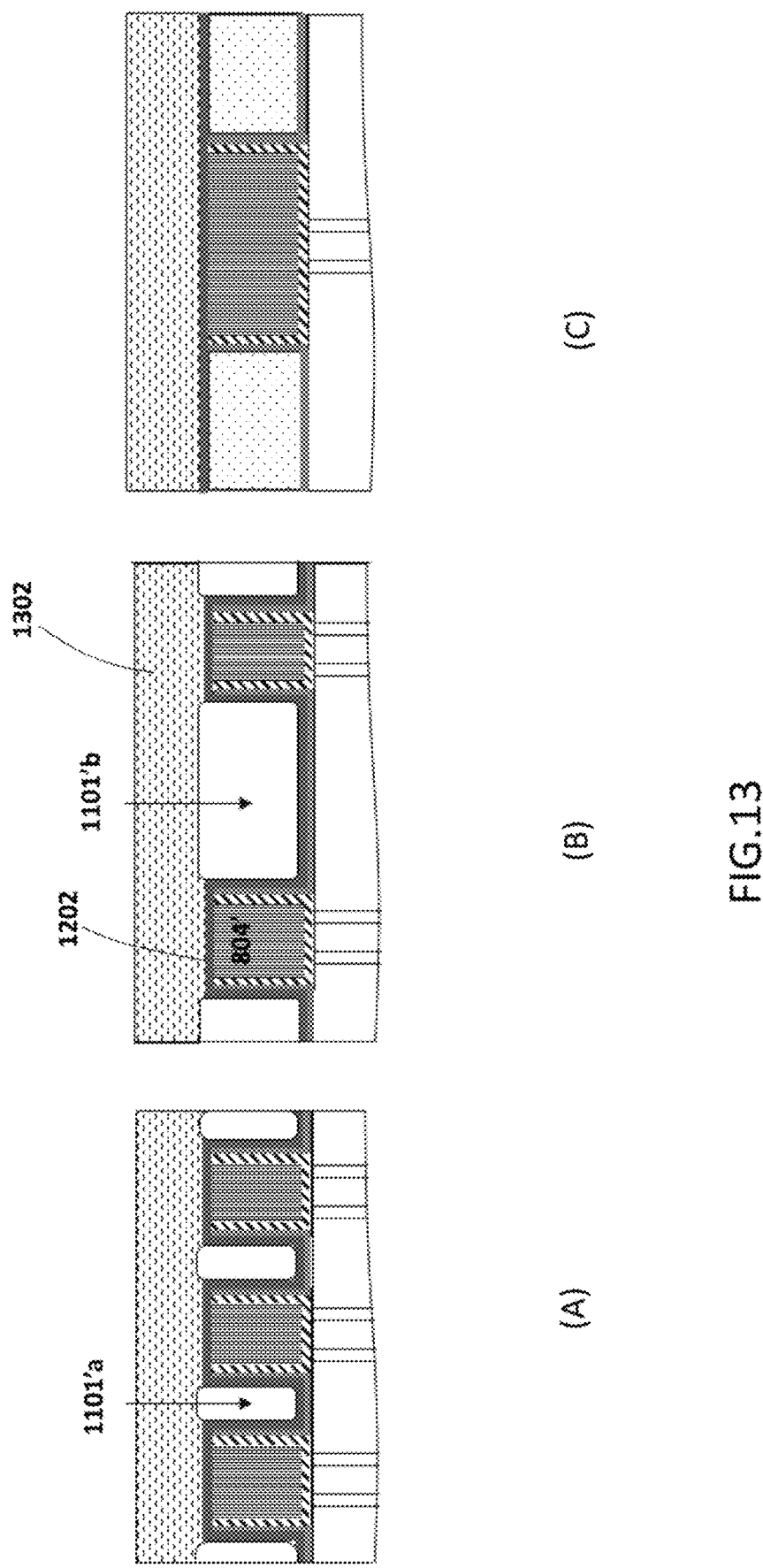

FIG. 13 shows a regional view of an intermediate structure of a semiconductor device in accordance with the instant disclosure during an exemplary fabrication process. In the illustrated figure, a low step-coverage deposition operation is performed to dispose dielectric material on the second liner 1202, which seals the gap 1101 between adjacent conductive features 804' without substantially filling the recess, thereby forming a void (air gap) 1101'a/1101'b between a pair of neighboring conductive features. In some embodiments, the film deposition operation includes performing a PVD process (such as sputtering or electron beam evaporation technique) using dielectric material as sputter target. In some embodiments, the performing of PVD process for forming a void between adjacent conductive feature includes forming a non-conformal sealing layer (e.g., third dielectric layer 1302 as shown in the instant figure) on the second liner 1202 over top surfaces of the conductive feature 804'.

Different PVD deposition systems may generate different profile for the voids 1101'a/b (as well as different trench bottom dielectric residual volume/profile). The arrangement of trench pitch distance (i.e., the spacing between conductive features 804') may also affect the profile of the voids 1101' and the amount of dielectric material deposited in the bottom portion of trenches (not shown). However, in general, when forming a dielectric layer (e.g., layer 1302) by PVD under proper conditions, a middle portion of the side wall surfaces (e.g., the vertical portions of the liners 602v/1202v) between the adjacent conductive features 804' may be substantially free form dielectric material. As such, the profile of the air gaps (e.g., void 1101') may have substantially uniform width. Moreover, in some scenarios, using electron beam evaporation systems (such as EVATEC co. ltd.) may achieve nearly zero deposition of dielectric material in the bottom portion of the trenches.

In some embodiment, solid phase materials containing Si or $SiO_2$ may be used as source target when performing the physical vapor deposition. The target may be of a tablet type, a granular type, a powder type, or a combination thereof. In some embodiments, the sealing layer (e.g., dielectric layer 1302) is formed by sputtering technique, in which a target to substrate distance is set in a range between 5 and 300 mm. In some embodiments, a chamber pressure is set at a range higher than $1 \times 10^{-3}$ torr. In some embodiments, the sealing layer is formed by electron beam evaporation process, in which a target to substrate distance is set in a range between 500 and 1500 mm. In some embodiments, a chamber pressure is set at a range higher than $1 \times 10^{-8}$ torr. In some embodiments, a thickness of the dielectric material may be less than 1 μm. In some embodiments, a thickness of the sealing layer (e.g., layer 1302) is not less than 50 nm. In some embodiments, the sealing layer may be formed by a combination of film deposition techniques. For instance, a PVD process with lower step coverage settings may be initially applied to dispose dielectric materials that seals the top of the inter-conductor trench. Subsequently, a more efficient deposition process (such as CVD) may be applied to form an inter-metal dielectric layer to a target thickness. In some embodiments, a power source for the sputtering deposition process may be DC magnetron, DC/RF magnetron, or DC/RF pulsed. During sputtering deposition process, processing gas such as Ar or Ar—$O_2$ may be used.

The dielectric material formed by PVD method using Si or $SiO_2$ as target may be substantially free from carbon and hydrogen content. Accordingly, it is possible to distinguish CVD or ALD dielectrics from PVD dielectrics through various thin film analysis methods such as FTIR, XPS. The absence/reduction of reaction byproduct such as carbon and hydrogen may reduce unforeseeable variation of electrical characteristics, thereby providing higher quality inter metal dielectric layer that requires no additional post treatment. Moreover, with the provision of void/air gap 1101' between conductive features (e.g., features 804') in the inter metal dielectric layer (e.g., layers 310/1302), higher device performance relating to RC delay or cross talk between conductor lines may be achieved (e.g., in some cases, over 5%).

Figure 14:
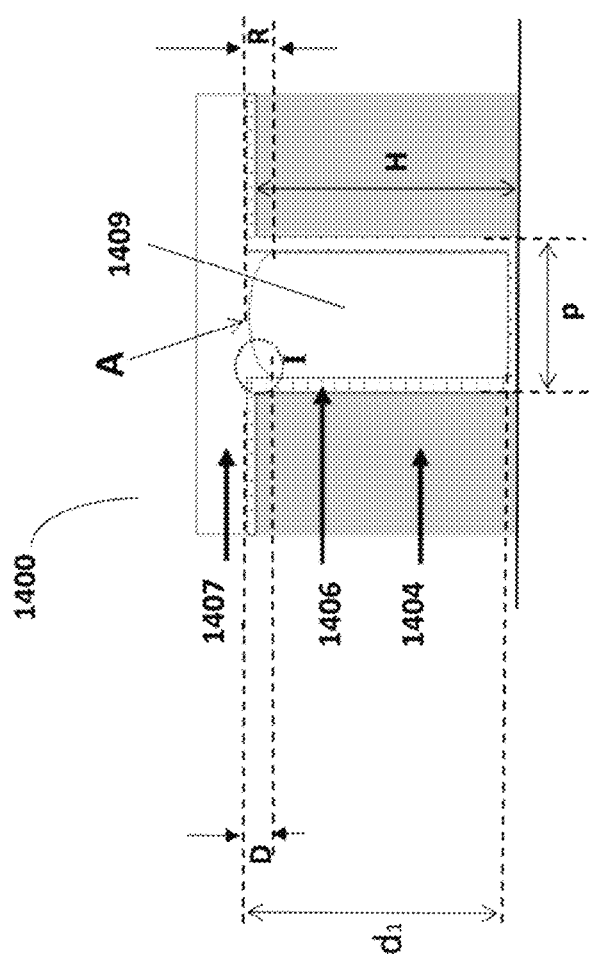
FIGS. 14-15 schematically illustrates regionally enlarged sectional view of an interconnect structure in accordance with some embodiments of the instant disclosure.
Figure 15:
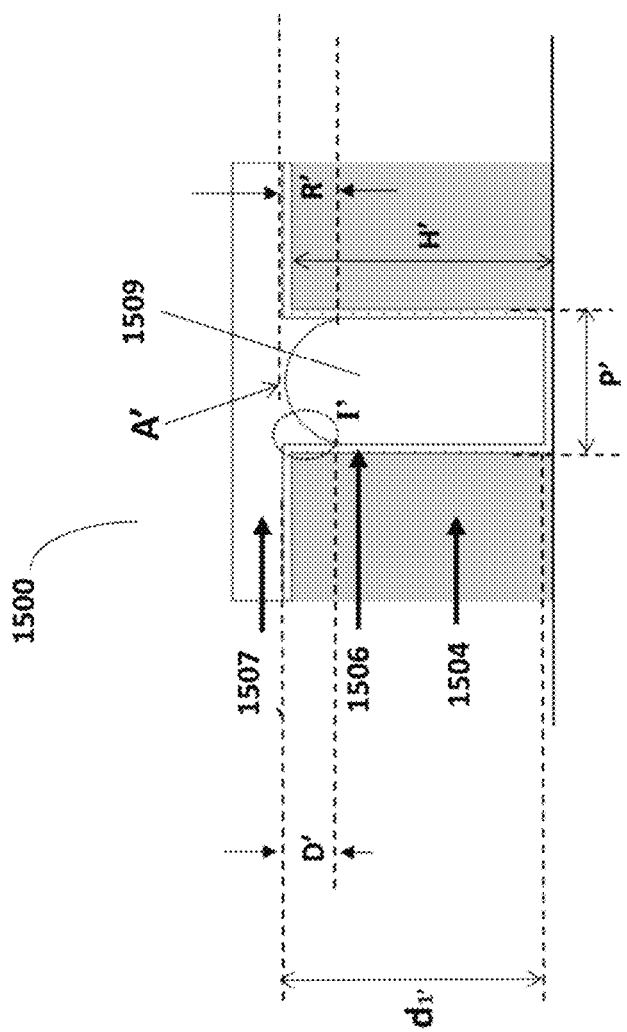

FIGS. 14 and 15 schematically show regionally enlarged sectional view of an interconnect structure in accordance with some embodiments of the instant disclosure, with particular focus on the sealing dielectric layer (e.g., layers 1407/1507) and the corresponding air gap profiles (e.g., voids 1409/1509).

Referring to FIG. 14, similar to that discussed previously with respect to FIG. 2, the interconnect structure 1400 comprises a dielectric liner (e.g., liner 1406) conformally formed over and between the plurality of conductive features 1404. In some embodiments, the conductive feature 1404 includes horizontal interconnecting components (e.g., laterally traversing conductive lines) that extends in a direction, e.g., in/out of the page as illustrated in FIG. 14. An inter-conductor trench having a first depth d1 (e.g., a height as measured from a trench bottom defined by the liner 1406 to a top surface of the horizontal liner coverage over the conductive feature 1404) is defined between adjacent pair of the metal lines. In the illustrated embodiments, dielectric liner 1406 is formed with thicker vertical coverage than horizontal coverage.

The inter-conductor trench further defines a separation pitch P between adjacent conductive features. 1404. The pitch P may be predetermined values based on the design rules for a particular application. In some embodiments, the pitch (e.g., separation P) between adjacent conductive patterns may be about 80 nm or less. In some embodiments, the pitch (e.g., separation P) between linear patterns may be about 40 nm or less. The pitch P between neighboring interconnect patterns may affect the corresponding air gap profile formed there-between.

The interconnect structure 1400 further comprises a sealing layer (e.g., dielectric layer 1407) formed on the liner 1406 over top surfaces of the conductive features 1404. In a cross section, the dielectric layer 1407 includes an intruding portion (e.g., as shown by portion I in the dashed circle) that extends into the inter-conductor trench. The intruding portion I reaches below the horizontal coverage of the liner 1406 and contacts the vertical coverage of the liner (e.g., as represented by intrusion depth D in FIG. 14). In addition, in the illustrated cross section, the sealing layer 1407 defines an arch profile between the intruding portion I on respective side wall surfaces of the liner 1406 between adjacent pair of the conductive features 1404. In the illustrated embodiment, the arch profile defines a downward facing concave profile between respective sidewall surfaces that define the trench between adjacent pair of the conductive features 1404. In some embodiments, the concave profile comprises a generally circular arc with a highest point (e.g., apex A) located between adjacent conductive features 1404.

Depending on deposition parameters, the location of point A may be higher, substantially equal to, or lower than the horizontal coverage of the liner 1406 above the top surfaces of respective conductive features 1404. However, with proper arrangements, the location of point A may be formed at about the same height as the horizontal coverage of the liner 1406, as illustrated in the instant figure. Moreover, with proper deposition conditions (such as discussed in previous embodiments), a middle section of side wall surface that defines the trench (between adjacent pair of the conductive features 1404) may be substantially free from dielectric material coverage (i.e., material from sealing layer 1407). In some embodiments, the resultant inter-conductor air gaps (e.g., void 1409) may be formed with substantially uniform profile having a height that is more than 90% the height H of the conductive feature 1404. In some embodiments, a ratio of the depth of sidewall coverage D to the first depth d1 is about less than 5%. The formation of an air gap profile that has a height close to the thickness (i.e., height H) of the conductive feature 1404 leads to maximized air gap volume, thereby translates to minimized dielectric constant in the IMD structure. On the other hand, the reduction of dielectric filling material at the air gap region inherently reduces the structural integrity in the IMD structure. The thicker vertical coverage of the dielectric liner 1406 in accordance with the instant disclosure provides enhanced mechanical strength to the air gap region in the interconnect structure, thereby increasing device reliability and improving manufacturing yield.

Figure 16:
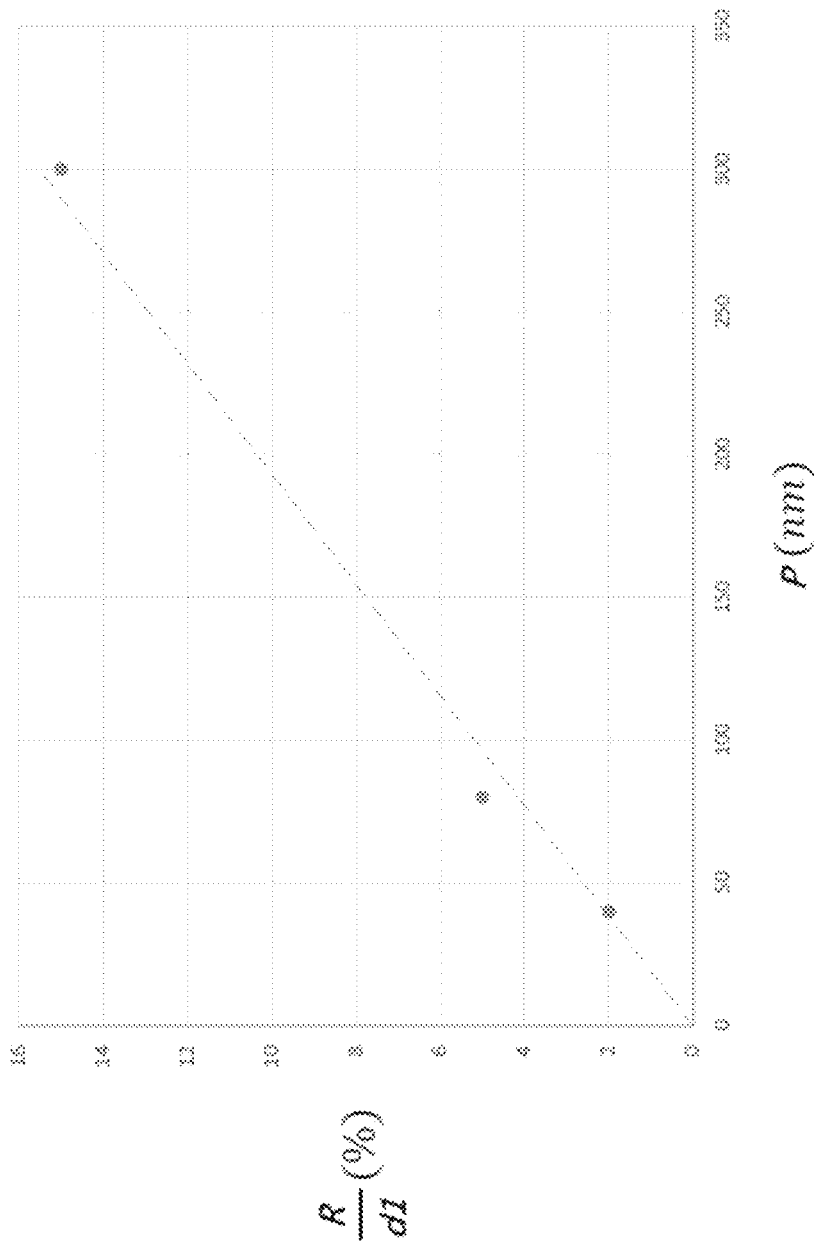
FIG. 16 shows a plot between rise to trench depth ratio with respect to pitch distance between conductive features.

In some embodiments, the arch profile defined by the sealing layer 1407 corresponds to an arch structure between adjacent pair of conductive features 1404. For instance, the arch structure of the dielectric layer 1407 may extend into and seals the trench between conductive features 1407 (e.g., metal lines), thereby forming a horizontally traversing air channel (e.g., air gap 1409) between adjacent metal lines. In the illustrated embodiment, the arch structure includes a downward facing concave surface that defines a rise R (i.e., a distance substantially measured from the lowest point of the intrusion portion I to the apex A). In some embodiments, a ratio between the rise of the arch structure and the first depth d1 is about less than 5%. In some embodiments, the predetermined separation P between adjacent pair of the conductive lines 1404 is substantially proportional to the ratio between the rise R to the first depth d1 (i.e., R/d1), as illustrated in the plot of FIG. 16.

For instance, in one end of the spectrum, when a pitch P between adjacent conductive features (e.g., features 1404) is about 45 nm, a corresponding rise to trench depth ratio (R/d1) has comparably small value of about 2. In another embodiment, a rise to depth ratio associated with a pitch distance of about 80 nm is about 5. At another end of the spectrum, at a large pitch separation of about 300 nm, an associated rise to trench depth ratio is about 15. In some embodiments, a larger pitch separation P leads to dielectric precipitation on the bottom liner surface between the conductive features (e.g., features 1404). In some embodiments, when the pitch separation P is too large, it becomes difficult for the dielectric material to seal the inter-conductor trench with filling it. Accordingly, air gap structures would less likely be generated in isolated feature regions, such as region C shown in FIG. 13. However, with proper pitch distance arrangement and deposition conditions, the bottom dielectric precipitation may be controlled within 1% of the conductor height (e.g., height H).

Referring to FIG. 15, similar to that discussed previously with respect to FIG. 2, the exemplary interconnect structure 1500 comprises a dielectric liner (e.g., liner 1506) conformally formed over and between the plurality of conductive features 1504. An inter-conductor trench having a depth d1' (e.g., a height as measured from a trench bottom defined by the liner 1506 to a top surface of the horizontal liner coverage over the conductive feature 1504) is defined between adjacent pair of the metal lines. The inter-conductor trench further defines a separation pitch P' between adjacent conductive features. 1504. The interconnect structure 1500 in the instant example corresponds to a larger pitch separation P' than that shown in the previous illustration of FIG. 14.

Similarly, the interconnect structure 1500 further comprises a sealing layer (e.g., dielectric layer 1507) formed on the liner 1506 over top surfaces of the conductive features 1504. With a greater pitch separation P' between the conductive features 1504, the intruding portion I' of the dielectric layer 1507 extends further into the inter-conductor trench. As discussed above, compared with the previous example, the intruding portion I' reaches further below the horizontal coverage of the liner 1506 and generates a greater intrusion depth D'. The sealing layer 1507 defines an arch profile between the intruding portion I' on respective side wall surfaces of the liner 1506 between adjacent pair of the conductive features 1504, and comprises a generally circular arc with a highest point (e.g., apex A'). Nevertheless, with proper deposition conditions (e.g., as discussed in accordance with the instant disclosure), a middle section of sidewall surface that defines the trench may be substantially free from dielectric material coverage. Accordingly, the resultant inter-conductor air gaps (e.g., void 1509) may be formed with substantially uniform profile having a height that is more than 90% the height H' of the conductive feature 1504.

Accordingly, one aspect of the instant disclosure provides a method, which comprises: forming an first dielectric layer on a lower device layer over a substrate; forming a second dielectric layer on the first dielectric layer, the second dielectric layer having different etch selectivity from the first dielectric layer; patterning the second dielectric layer to form a plurality of linear recess features therein that expose the first dielectric layer, the plurality of linear recess features having sections that extend abreast one another at predetermined separation; disposing a first liner having different etch selectivity from the second dielectric layer substantially conformally over exposed surfaces of the linear recess features in the second dielectric layer; forming vertical liner structures in the linear recess features by selectively removing horizontal coverage of the first liner to expose the lower device layer; disposing conductive material in exposed region of the linear recess features to form a plurality of conductive lines with vertical liner coverage from the first liner over the respective sidewall surface thereof; removing the patterned second dielectric layer between the conductive lines to form trench respectively between adjacent conductive lines; disposing a second liner (N2) conformally over the conductive lines to increase thickness of vertical liner coverage over the respective sidewall surface thereof; and performing physical vapor deposition (PVD) process to dispose dielectric material on the second liner to seal the trench and form a void between adjacent conductive lines.

Accordingly, another aspect of the instant disclosure provides an interconnect structure that comprises: a plurality of conductive features over a substrate arranged separately adjacent one another; a liner conformally formed over and between the plurality of conductive features and defining a trench having a first depth between adjacent pair of the conducive features, wherein a horizontal coverage of the liner over respective top surfaces of the conductive features has thickness lower than that of a vertical coverage over respective sidewalls of the conductive features; and a dielectric layer on the liner over top surfaces of the conductive features, wherein the dielectric layer seals the respective trench and forms a void between adjacent pair of the conductive features.

Accordingly, yet another aspect of the instant disclosure provides an interconnect structure that comprises: a plurality of conductive lines over a substrate having sections that extend abreast one another at predetermined separation; a dielectric liner conformally formed over and between the plurality of conductive lines and defining a trench having a first depth between adjacent pair of the metal lines, wherein a horizontal coverage of the liner over respective top surfaces of the conductive lines has thickness lower than a vertical coverage thereof over respective sidewalls of the metal lines; and a dielectric layer formed on the dielectric liner over top surfaces of the conductive lines, wherein the dielectric layer forms an arch structure that extends into and seals the respective trench, and defines an air channel between adjacent pair of the conductive lines.

The embodiments shown and described above are only examples. Many details are often found in the art such as the other features of a logistics data management method. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the embodiments described above may be modified within the scope of the claims.

What is claimed is:

1. An interconnect structure, comprising:
a plurality of conductive features (M) over a substrate arranged separately adjacent one another;
a liner (Ln) conformally formed over and between the plurality of conductive features and defining a trench having a first depth (D1) between adjacent pair of the conductive features,
wherein a horizontal coverage of the liner over respective top surfaces of the conductive features has thickness lower than that of a vertical coverage over respective sidewalls of the conductive features; and
a dielectric layer on the liner over top surfaces of the conductive features, wherein the dielectric layer seals the respective trench and forms a void between adjacent pair of the conductive features;
wherein the dielectric layer comprises an intruding portion that extends into the trench below the horizontal coverage of the liner and contacts the vertical coverage of the liner;
wherein a middle section of side wall surface that defines the trench between adjacent pair of the conductive features is substantially free from the dielectric layer coverage.

2. The structure of claim 1,
wherein a thickness ratio between the horizontal coverage of the liner to the vertical coverage of the liner ranges from about 0.3 to about 0.7.

3. The structure of claim 1,
wherein the dielectric layer forms an arch profile between the intruding portion on respective side wall surfaces that define the trench between adjacent pair of the conductive features.

4. The structure of claim 1,
wherein the intruding portion defines a depth of sidewall coverage (D), wherein a ratio of the depth of sidewall coverage (d) to the first depth (d1) is about less than 5%.

5. The structure of claim 3,
wherein the arch profile defines a downward facing concave profile between respective side wall surfaces that define the trench between adjacent pair of the conductive features.

6. The structure of claim 1,
wherein the liner (Ln) includes a nitride dielectric material.

7. The structure of claim 1,
wherein the dielectric layer is substantially free from carbon and hydrogen.

8. An interconnect structure, comprising:
a plurality of conductive lines over a substrate having sections that extend abreast one another at predetermined separation;
a dielectric liner conformally formed over and between the plurality of conductive lines and defining a trench having a first depth between adjacent pair of the conductive lines,
wherein a horizontal coverage of the liner over respective top surfaces of the conductive lines has thickness lower than a vertical coverage thereof over respective sidewalls of the conductive lines; and
a dielectric layer formed on the dielectric liner over top surfaces of the conductive lines,
wherein the dielectric layer forms an arch structure that extends into and seals the respective trench, and defines an air channel between adjacent pair of the conductive lines;
wherein the dielectric layer comprises an intruding portion that extends into the trench below the horizontal coverage of the liner and contacts the vertical coverage of the liner;
wherein a middle section of side wall surface that defines the trench between adjacent pair of the conductive features is substantially free from the dielectric layer coverage.

9. The structure of claim 8,
wherein the arch structure includes a downward facing concave surface and defines a rise.

10. The structure of claim 9,
wherein a ratio between the rise of the arch structure and the first depth is about less than 5%.

11. The structure of claim 10,
wherein the predetermined separation between adjacent pair of the conductive lines is substantially proportional to a ratio between the rise to the first depth.

12. The structure of claim 8,
wherein the conductive line comprises a conductive containing material that includes at least one of Ta, TaN, Cu, CuMn, Co, Ni, Ag, Au, and Pt.

13. The structure of claim 8,
wherein the liner includes a nitride dielectric material.

14. The structure of claim 8,
wherein the dielectric layer is substantially free from carbon and hydrogen.

* * * * *